United States Patent
Li

(10) Patent No.: US 10,665,597 B2
(45) Date of Patent: May 26, 2020

(54) SEMICONDUCTOR STRUCTURE AND METHOD FOR FORMING THE SAME

(71) Applicant: UNITED MICROELECTRONICS CORP., Hsinchu (TW)

(72) Inventor: Shin-Hung Li, Nantou County (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 0 days.

(21) Appl. No.: 15/949,368

(22) Filed: Apr. 10, 2018

(65) Prior Publication Data
US 2019/0279994 A1    Sep. 12, 2019

(30) Foreign Application Priority Data
Mar. 12, 2018   (CN) .......................... 2018 1 0200436

(51) Int. Cl.
*H01L 27/112* (2006.01)
*H01L 23/525* (2006.01)

(52) U.S. Cl.
CPC .... *H01L 27/11206* (2013.01); *H01L 23/5252* (2013.01)

(58) Field of Classification Search
CPC ...................... H01L 23/5252; H01L 27/11206
See application file for complete search history.

(56) References Cited

U.S. PATENT DOCUMENTS

| 9,023,699 | B2 | 5/2015 | Chang et al. |
| 2005/0212021 | A1* | 9/2005 | Tu ..................... H01L 27/10894 257/296 |
| 2014/0327086 | A1* | 11/2014 | Lai ..................... H01L 23/5228 257/380 |
| 2015/0102395 | A1* | 4/2015 | Park ..................... H01L 23/642 257/301 |

OTHER PUBLICATIONS

Liu et al. "U.S. Appl. No. 15/807,528" filed Nov. 8, 2017, USA.

* cited by examiner

*Primary Examiner* — Elias Ullah
(74) *Attorney, Agent, or Firm* — WPAT, PC

(57) ABSTRACT

A semiconductor structure and a method for forming the same are provided. The semiconductor structure includes a substrate, a resistive random access memory cell, and a semiconductor element. The resistive random access memory cell is on the substrate. The resistive random access memory cell includes a first electrode having a U shape. The semiconductor element is adjoined with an outer sidewall of the first electrode.

9 Claims, 8 Drawing Sheets

US 10,665,597 B2

SEMICONDUCTOR STRUCTURE AND METHOD FOR FORMING THE SAME

This application claims the benefit of People's Republic of China application Serial No. 201810200436.3 filed Mar. 12, 2018, the subject matter of which is incorporated herein by reference.

BACKGROUND

Technical Field

The disclosure relates to a semiconductor structure and a method for forming the same.

Description of the Related Art

With a trend of shrinking a line width of a semiconductor process, a size of a semiconductor structure, comprising for example a transistor or a memory array, etc., has been scaled down. However, manufacturing steps for the semiconductor structure have in increased with a variation trend of the semiconductor structure. The manufacturing steps become complicated, which results in difficulty in improving product efficiency. In addition, a design layout for the semiconductor structure also has an influence to an operating efficiency of a device.

SUMMARY

The present disclosure relates to a semiconductor structure and a method for forming the same.

According to an embodiment, a semiconductor structure is disclosed. The semiconductor structure comprises a substrate, a resistive random access memory cell, and a semiconductor element. The resistive random access memory cell is on the substrate. The resistive random access memory cell comprises a first electrode having a U shape. The semiconductor element is adjoined with an outer sidewall of the first electrode.

According to another embodiment, a method for forming a semiconductor structure is disclosed. The method comprises the following steps. A semiconductor layer is formed on a substrate. A portion of the semiconductor layer is removed to form an opening. A remained portion of the semiconductor layer forms a semiconductor element. A first electrode having a U shape is formed in the opening.

Figure 1A:
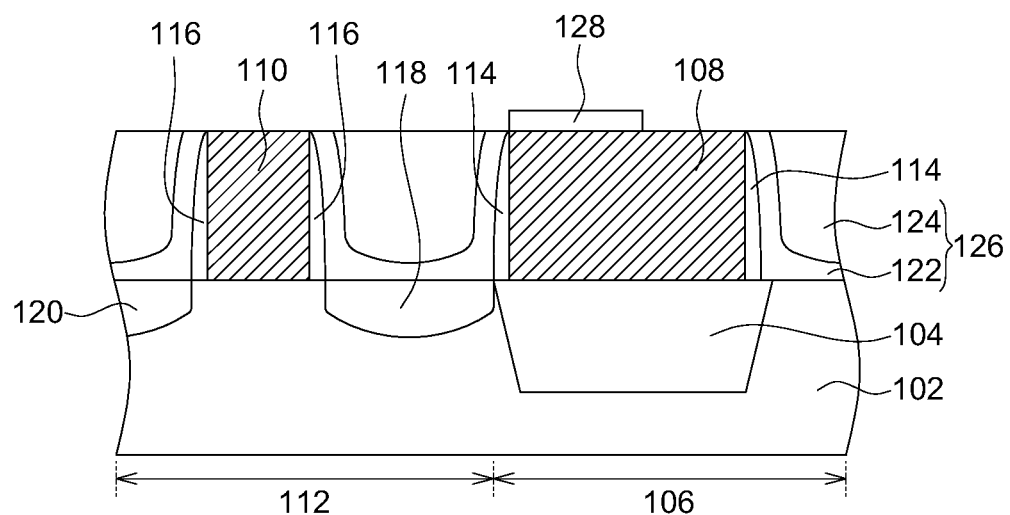
FIG. 1A to FIG. 1G illustrate a method for forming a semiconductor structure according a concept of a first embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Embodiments are provided hereinafter with reference to the accompanying drawings for describing the related procedures and configurations. It is noted that not all embodiments of the invention are shown. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense. The identical and/or similar elements of the embodiments are designated with the same and/or similar reference numerals.

FIG. 1A to FIG. 1G illustrate a method for forming a semiconductor structure according a concept of a first embodiment.

Referring to FIG. 1A, a substrate 102 is provided. The substrate 102 may comprise a silicon substrate, a silicon on insulator (SOI), or other suitable semiconductor substrates. An isolation element 104 is formed in the substrate 102 in a first region 106. For example, the isolation element 104 may comprise a shallow trench isolation structure, a deep trench isolation structure, a field oxide structure, or other suitable insulating structures. A semiconductor layer 108 is formed on the isolation element 104. In an embodiment, the semiconductor layer 108 may comprise an un-doped polysilicon. However, the present disclosure is not limited thereto. A sacrificial gate 110 (or dummy gate) is formed on the substrate 102 in a second region 112. In an embodiment, the semiconductor layer 108 and the sacrificial gate 110 are formed simultaneously with the same process. However, the present disclosure is not limited thereto. The semiconductor layer 108 and the sacrificial gate 110 may be individually formed. A spacer 114 is formed on a sidewall of the semiconductor layer 108. A spacer 116 is formed on a sidewall of the sacrificial gate 110. In an embodiment, the spacer 114 and the spacer 116 may be formed simultaneously with the same process. A doping step may be performed to form source/drain doped regions 118 and 120 in the substrate 102 outside the spacer 116. A dielectric layer 122 may be formed on the substrate 102 and the spacers 114 and 116. A dielectric layer 124 may be formed on the dielectric layer 122. In embodiments, a dielectric layer 126 may comprise the dielectric layer 122 and the dielectric layer 124. A hard mask layer 128 may be formed on the semiconductor layer 108. In an embodiment, the hard mask layer 128 comprises titanium nitride (TiN), but is not limited thereto, and may use other suitable materials.

Figure 1B:
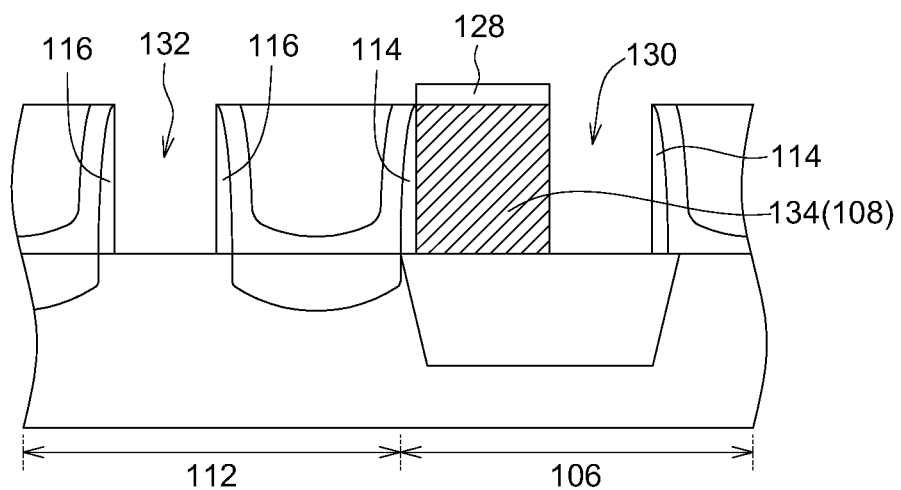
Figure 1C:
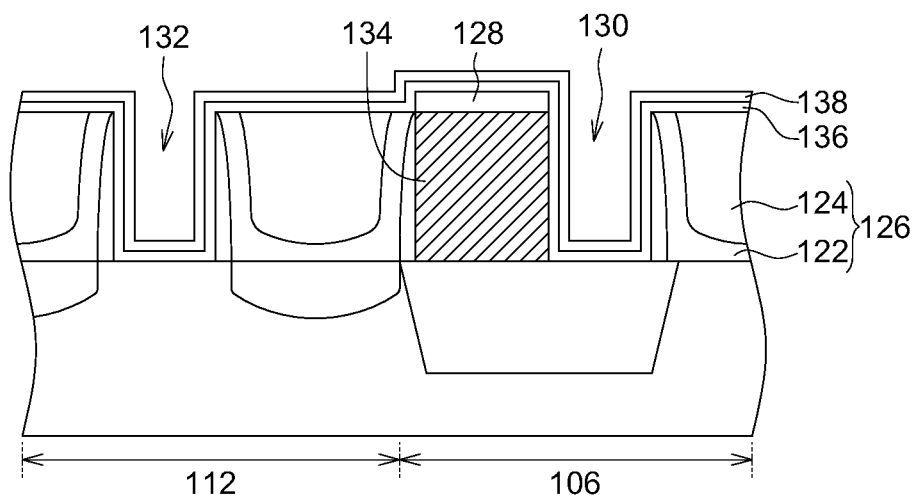

Referring to FIG. 1B, an etching step may be performed to remove a portion of the semiconductor layer 108 not covered by the hard mask layer 128 to form an opening 130 defined with the spacer 114 and a remained portion of the semiconductor layer 108, and remove the sacrificial gate 110 to form an aperture 132 defined with the spacers 116. In an embodiment, the semiconductor layer 108 and the sacrificial gate 110 may be removed simultaneously. In embodiments, the remained portion of the semiconductor layer 108 forms a semiconductor element 134.

Referring to FIG. 1O, a first electrode 136 may be formed in the aperture 132 and the opening 130. The first electrode 136 may be also formed on the dielectric layer 126 and the hard mask layer 128. In an embodiment, the first electrode 136 may comprise titanium nitride (TiN), tantalum nitride (TaN), titanium-aluminium alloy (TiAl), etc., but is not limited thereto. For example, the first electrode 136 may be a conformal film formed by a deposition method, but is not limited thereto. The semiconductor element 134 is adjoined with an outer sidewall of the first electrode 136. A resistive layer 138 may be formed on the first electrode 136. For example, the resistive layer 138 may be a conformal film formed by a deposition method, but is not limited thereto.

Figure 1D:
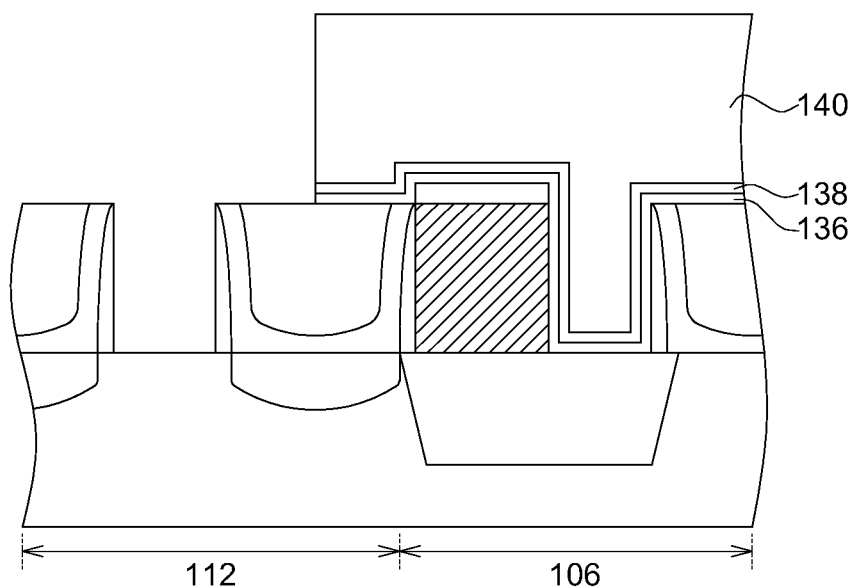

Referring to FIG. 1D, a patterned photoresist layer 140 may be formed to cover the resistive layer 138. An etching step may be performed to remove the first electrode 136 and the resistive layer 138 exposed by the photoresist layer 140 in the second region 112. Then the photoresist layer 140 is removed.

Figure 1E:
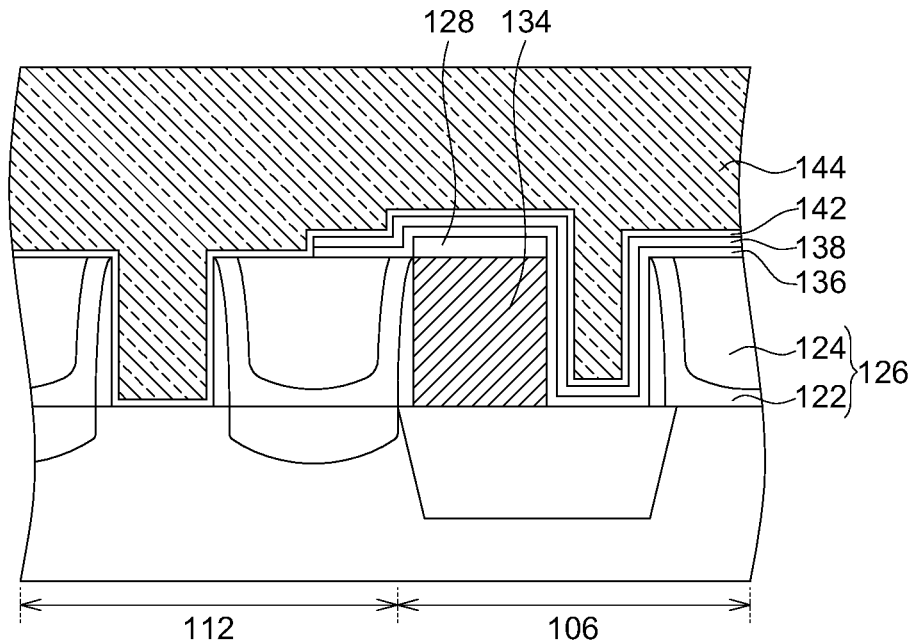

Referring to FIG. 1E, an electrode film 142 is formed on the resistive layer 138 in the first region 106, and in the aperture 132 in the second region 112, and on the dielectric layer 126. In an embodiment, for example, the electrode film 142 may comprise a work function material, such as titanium nitride (TiN), tantalum nitride (TaN), titanium-aluminium alloy (TiAl), etc., but is not limited thereto. The electrode film 142 may be a conformal film formed by a deposition method. An electrode layer 144 is formed on the electrode film 142, and filling the opening 130 and the aperture 132. In an embodiment, the electrode layer 144 may comprise aluminum, but is not limited thereto, and may use other materials having good conductivity, such as other kinds of metals, and so on.

Figure 1F:
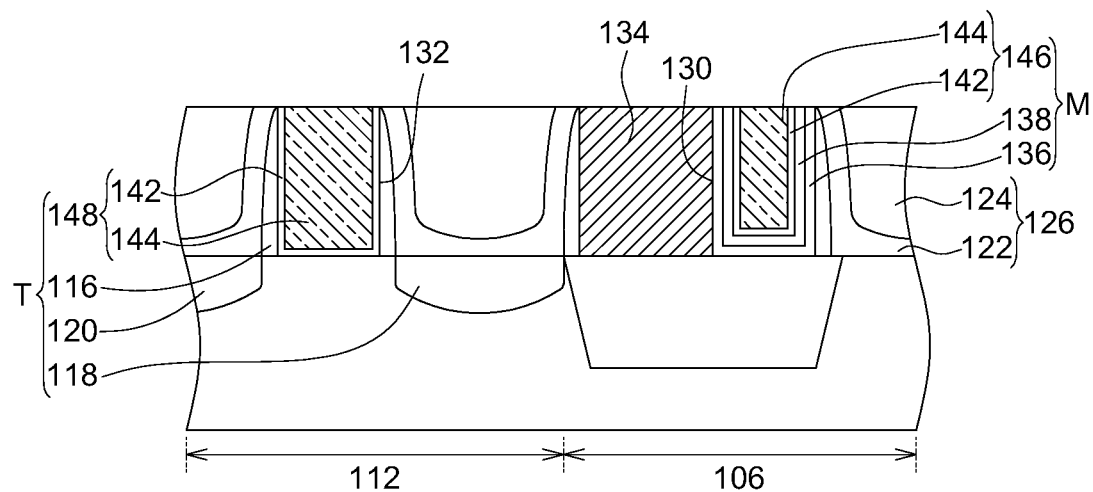

Referring to FIG. 1F, a planarization step may be performed by a chemical mechanical polishing method to remove the electrode layer 144, the electrode film 142, the resistive layer 138, the first electrode 136 and the hard mask layer 128 over the dielectric layer 126 and/or the semiconductor element 134. In an embodiment, a resistive random access memory cell M may comprise the first electrode 136, the resistive layer 138 and a second electrode 146 in the first region 106. The second electrode 146 may comprise the electrode film 142 and the electrode layer 144 in the opening 130. The first electrode 136, the resistive layer 138 and the electrode film 142 of the second electrode 146 may have a U shape. The first electrode 136 of the resistive random access memory cell M may be used as a bottom electrode, the second electrode 146 may be used as a top electrode, and the resistive layer 138 is electrically connected between the first electrode 136 and the second electrode 146. The first electrode 136 and the second electrode 146 have opposing polarities. For example, the first electrode 136 is a positive electrode, and the second electrode 146 is a negative electrode, or works in reverse. A transistor T may comprise a gate electrode 148, the spacer 116 and the source/drain doped regions 118 and 120 in the second region 112. The gate electrode 148 may comprise the electrode film 142 and the electrode layer 144 in the aperture 132. The electrode film 142 has a U shape.

Figure 1G:
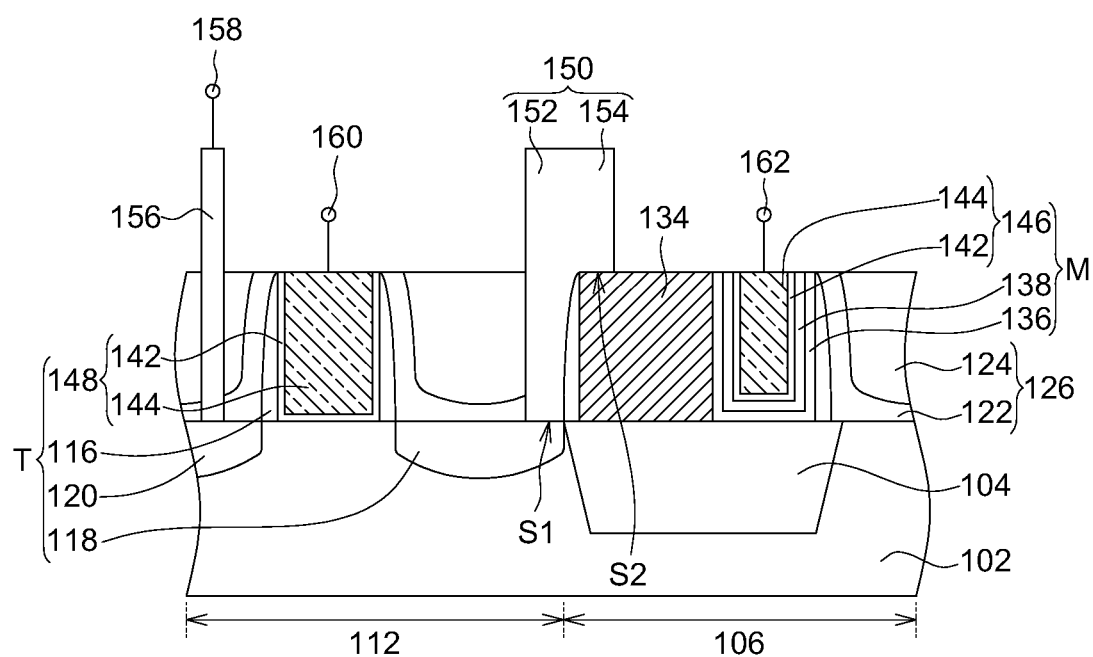

Referring to FIG. 1G, a conductive element 150 may be formed in the first region 106. The conductive element 150 may comprise a metal, but is not limited thereto, or may use other materials having good conductivity. The conductive element 150 may comprise a first conductive portion 152 and a second conductive portion 154 adjacent to the first conductive portion 152. The first conductive portion 152 may pass through another dielectric film (such as an interlayer dielectric film, not shown) over the dielectric layer 126, and pass through the dielectric layer 126, and have a first lower surface S1 landing on and electrically connected on the source/drain doped region 118 of the transistor T. The second conductive portion 154 may pass through the another dielectric film (not shown) above the dielectric layer 126, and have a second lower surface S2 landing on and electrically connected the on semiconductor element 134. A conductive element 156 may pass through the another dielectric film (not shown) over the dielectric layer 126, and pass through the dielectric layer 126, and land on and electrically connected on the source/drain doped region 120 of the transistor T. In an embodiment, the conductive element 156 may be electrically connected to a selection line 158. The electrode layer 144 of the transistor T may be electrically connected to a word line 160. The electrode layer 144 of the resistive random access memory cell M may be electrically connected to a bit line 162. The source/drain doped region 118 of the transistor T may be electrically connected to the first electrode 136 of the resistive random access memory cell M through the conductive element 150 and the semiconductor element 134. The semiconductor element 134 may function as a resistor. The resistive random access memory cell M and the semiconductor element 134 may be electrically isolated from the substrate 102 by the isolation element 104.

In embodiments, the resistive layer 138 has a U-shape outer surface adjoined with a U-shape inner surface of the first electrode 136, and the resistive layer 138 has a U-shape inner surface adjoined with a U-shape outer surface of the electrode film 142. An area of the resistive layer 138 adjoined with the electrode is large. For example, in the same area of the first region 106, an effective area of the U-shape resistive layer 138 adjoined with the electrode in embodiments is three times an effective area of an I-shape resistive layer adjoined with the electrode in a comparative example. Therefore, according to embodiments, a current density in the resistive layer 138 during an information access process in the resistive random access memory cell M can be reduced to decrease power consumption. Therefore, the semiconductor structure according to embodiments can have better operating efficiency.

In the manufacturing concept of embodiments, the resistive random access memory cell M, the semiconductor element 134 and the transistor T may be used to form a one-transistor and one-resistor (1T1R) structure with integrated processes, for example integrated with a CMOS process. Therefore, the method can have better product efficiency.

FIG. 2A to FIG. 2H illustrate a method for forming a semiconductor structure according a concept of a second embodiment.

Figure 2A:
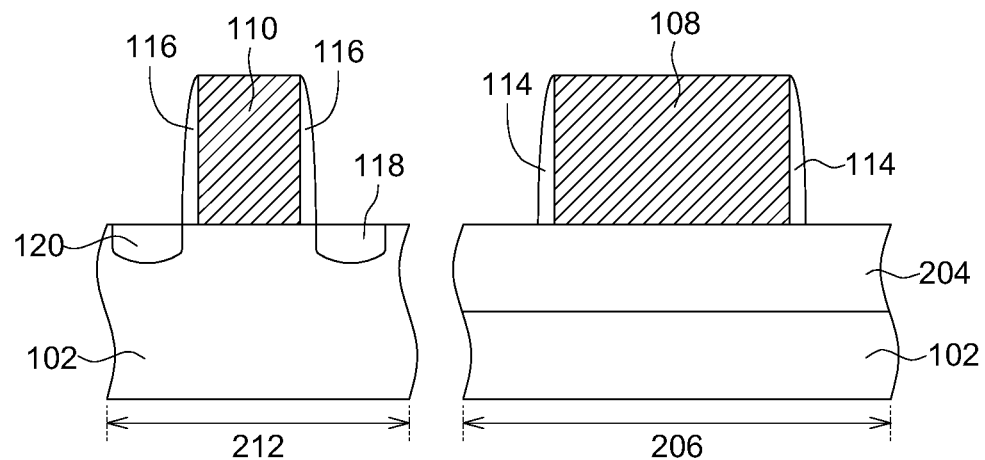
FIG. 2A to FIG. 2H illustrate a method for forming a semiconductor structure according a concept of a second embodiment.

Referring to FIG. 2A, an isolation element 204 may be formed in the substrate 102 in a first region 206. The semiconductor layer 108 may be formed on the isolation element 204. The sacrificial gate 110 is formed on the substrate 102 in a second region 212. In an embodiment, the semiconductor layer 108 and the sacrificial gate 110 may be formed simultaneously. The spacer 114 is formed on the sidewall of the semiconductor layer 108. The spacer 116 is formed on the sidewall of the sacrificial gate 110. A doping step may be performed to form the source/drain doped regions 118 and 120 in the substrate 102 outside the spacers 116.

Figure 2B:
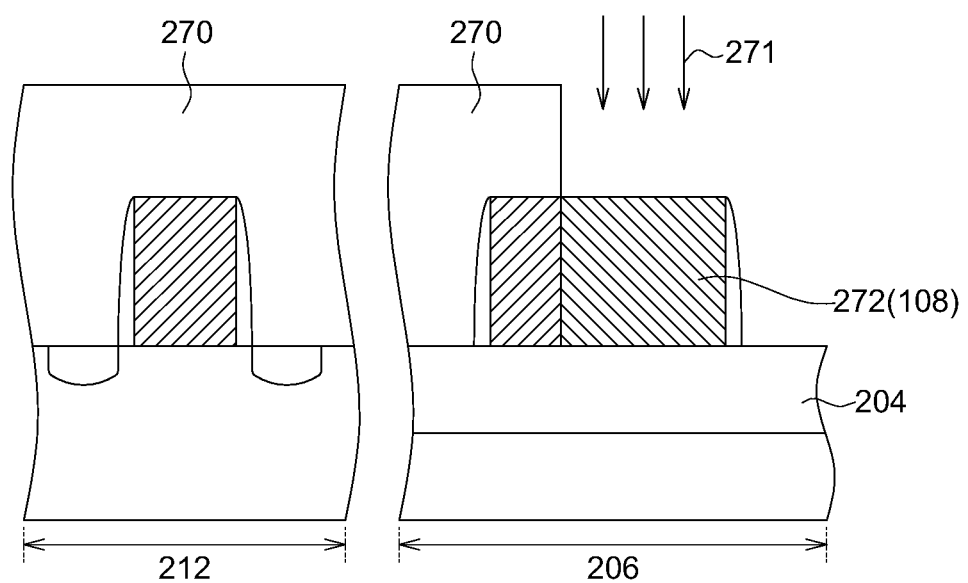

Referring to FIG. 2B, a patterned mask layer 270 may be formed. A doping step 271A is performed to a portion of the semiconductor layer 108 exposed by the mask layer 270 to form a semiconductor doped layer 272.

Figure 2C:
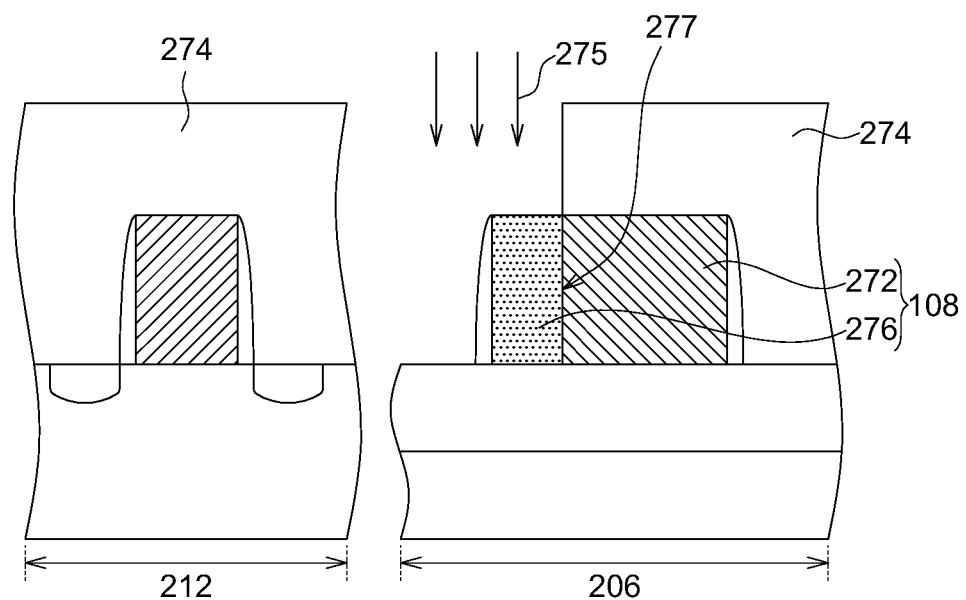

Referring to FIG. 2C, a patterned mask layer 274 may be formed. A doping step 275 may be performed to a portion of the semiconductor layer 108 exposed by the mask layer 274 to form a semiconductor doped layer 276. In embodiments, the semiconductor doped layer 272 and the semiconductor doped layer 276 may respectively have opposing conductivities by controlling dopant types. For example, in an embodiment, the semiconductor doped layer 272 has a N-type conductivity and is a N-type portion, while the semiconductor doped layer 276 has a P-type conductivity and is a P-type portion. In another embodiment, the semiconductor doped layer 272 has a P-type conductivity and is a P-type portion, while the semiconductor doped layer 276 has a N-type conductivity and is a N-type portion. The semiconductor doped layer 272 and the semiconductor doped layer 276 have a PN junction 277 therebetween.

Figure 2D:
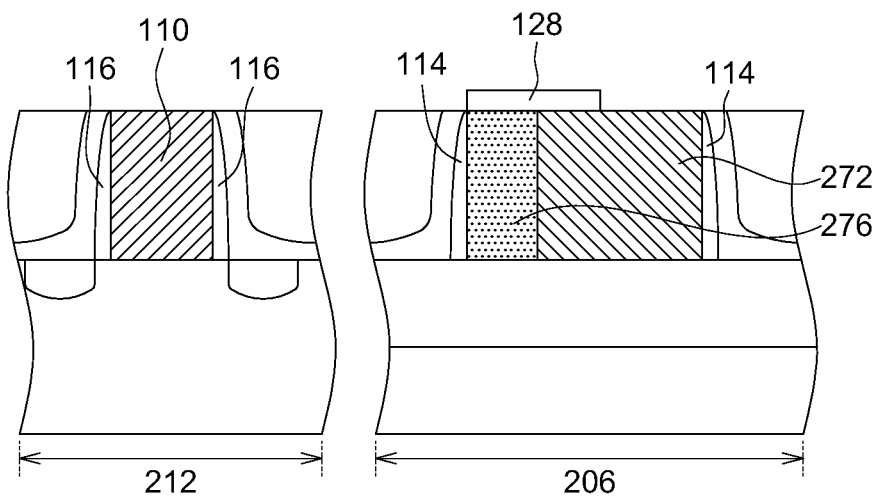

Referring to FIG. 2D, the hard mask layer 128 may be formed on the semiconductor doped layer 276 and a portion of the semiconductor doped layer 272.

Figure 2E:
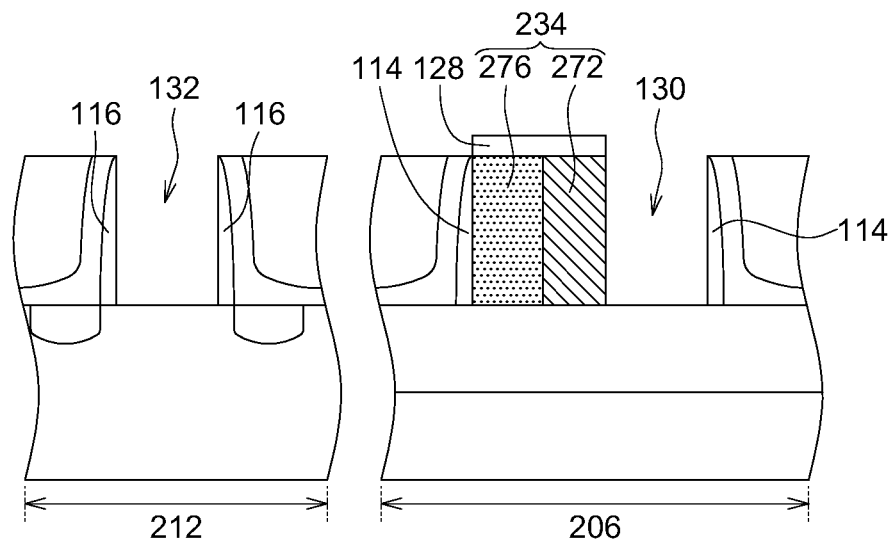

Referring to FIG. 2E, an etching step may be performed to remove a portion of the semiconductor doped layer 272 not covered by the hard mask layer 128 to form the opening 130 defined with the spacer 114 and a remained portion of the semiconductor doped layer 272, and remove the sacrificial gate 110 to form the aperture 132 defined with the spacers 116. In an embodiment, the semiconductor doped layer 272 and the sacrificial gate 110 may be removed simultaneously. In embodiments, the remained portion of the semiconductor doped layer 272 and the semiconductor doped layer 276 form a semiconductor element 234.

Figure 2F:
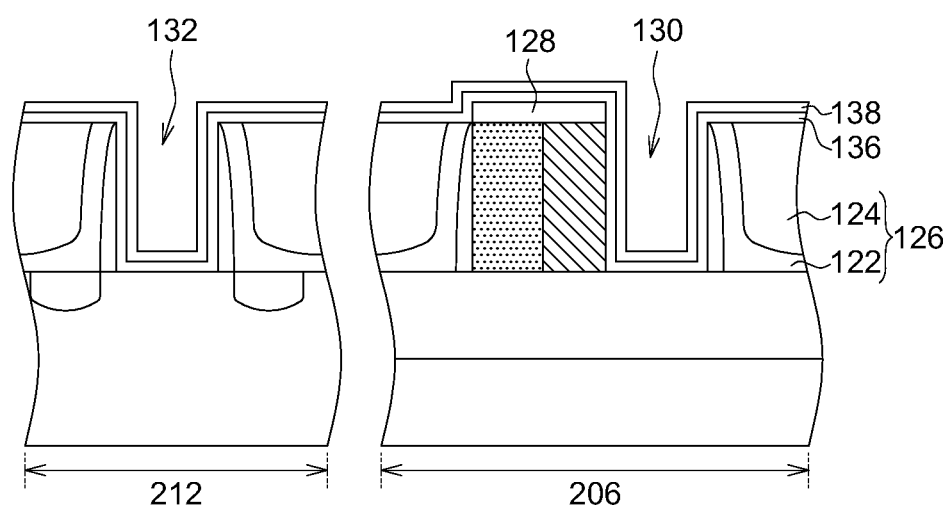

Referring to FIG. 2F, the first electrode 136 may be formed in the aperture 132 and the opening 130. The first electrode 136 may be also formed on the dielectric layer 126 and the hard mask layer 128. The resistive layer 138 may be formed on the first electrode 136.

Figure 2G:
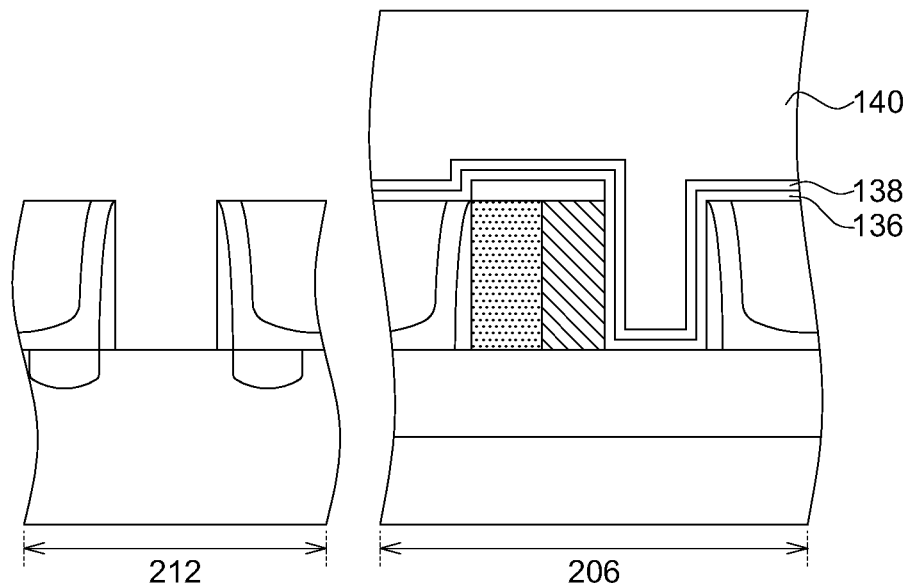

Referring to FIG. 2G, the patterned photoresist layer 140 may be formed to cover the resistive layer 138 of the first region 206. An etching step may be performed to remove the first electrode 136 and the resistive layer 138 exposed by the photoresist layer 140 in the second region 112. Then the photoresist layer 140 is removed.

Figure 2H:
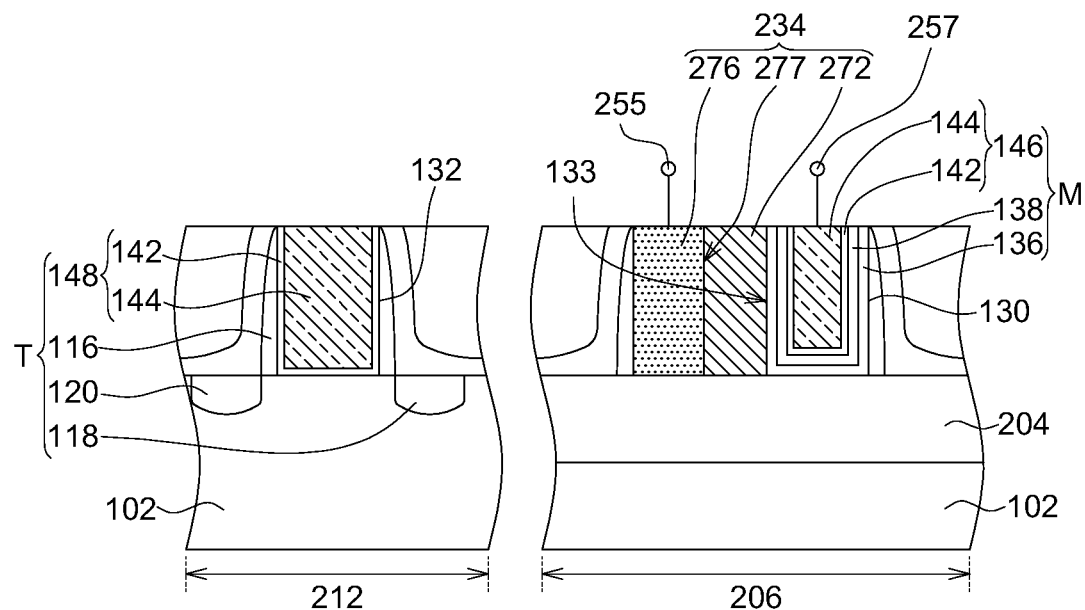

Referring to FIG. 2H, the electrode film 142 is formed on the resistive layer 138 in the opening 130 in the first region 206, and in the aperture 132 in the second region 212. In an embodiment, the electrode film 142 may be a conformal film formed by a deposition method. The electrode layer 144 is formed on the electrode film 142 in the opening 130 and the aperture 132. A planarization step may be performed by a chemical mechanical polishing method to remove the electrode layer 144, the electrode film 142, the resistive layer 138, the first electrode 136 and the hard mask layer 128 above the dielectric layer 126 and/or the semiconductor element 234. The electrode film 142 and the electrode layer 144 in the opening 130 may form the second electrode 146. The gate electrode 148 may comprise the electrode film 142 and the electrode layer 144 in the aperture 132. In an embodiment, the resistive random access memory cell M may comprise the first electrode 136, the resistive layer 138 and the second electrode 146 in the first region 206. The first electrode 136, the resistive layer 138 and the electrode film 142 of the second electrode 146 may have a U shape. The semiconductor element 234 comprising the semiconductor doped layer 272 and the semiconductor doped layer 276 is used as a diode. The semiconductor doped layer 272 is electrically connected on an outer sidewall 133 of the first electrode 136. In an embodiment, the PN junction 277 may be substantially parallel to the outer sidewall 133 of the first electrode 136 with which the semiconductor doped layer 272 is adjoined. The semiconductor doped layer 276 may be electrically connected to a bottom electrode terminal 255, and the electrode layer 144 may be electrically connected to a top electrode terminal 257. The transistor T may comprise the gate electrode 148, the spacer 116 and the source/drain doped regions 118 and 120 in the second region 212. In an embodiment, the second region 212 may be a logic region. The resistive random access memory cell M and the semiconductor element 234 may be electrically isolated from the substrate 102 by the isolation element 204.

In the manufacturing concept of embodiments, the resistive random access memory cell M and the semiconductor element 234 may be used to form a one-diode and one-transistor (1D1R) structure with integrated processes, for example integrated with a CMOS process comprising the transistor T. Therefore, the method can have better product efficiency.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
a substrate;
a resistive random access memory cell on the substrate, and the resistive random access memory cell comprising a first electrode having a U shape, a second electrode and a resistive layer between the first electrode and the second electrode; and
a semiconductor element adjoined with an outer sidewall of the first electrode, wherein a top surface of the semiconductor element is coplanar with a top surface of the first electrode, and the semiconductor element is in direct contact with the resistive random access memory cell.

2. The semiconductor structure according to claim 1, wherein the resistive layer has a U shape.

3. The semiconductor structure according to claim 1, wherein the semiconductor element functions as a resistor.

4. The semiconductor structure according to claim 1, further comprising opposing spacers respectively on the first electrode and the semiconductor element.

5. The semiconductor structure according to claim 1, wherein the semiconductor element is a diode having a N-type portion and a P-type portion, one of the N-type portion and the P-type portion is adjoined with the outer sidewall of the first electrode.

6. The semiconductor structure according to claim 5, wherein a PN junction between the N-type portion and the P-type portion is substantially parallel to the outer sidewall of the first electrode.

7. The semiconductor structure according to claim 1, further comprising a transistor on the substrate and comprising a gate electrode, wherein the second electrode has a polarity opposing to a polarity of the first electrode, each of the gate electrode and the second electrode comprises an electrode film and an electrode layer on the electrode film having a U shape.

8. The semiconductor structure according to claim 1, further comprising an isolation element, wherein the resistive random access memory cell and the semiconductor element are isolated from the substrate by the isolation element.

9. The semiconductor structure according to claim 1, further comprising a transistor and a conductive element, wherein the transistor comprises a source/drain doped region in the substrate, the conductive element has a first lower surface and a second lower surface respectively electrically connected to the source/drain doped region and the semiconductor element.

\* \* \* \* \*